(12) United States Patent
Mikagi

(10) Patent No.: US 6,232,227 B1
(45) Date of Patent: May 15, 2001

(54) METHOD FOR MAKING SEMICONDUCTOR DEVICE

(75) Inventor: Kaoru Mikagi, Tokyo (JP)

(73) Assignee: NEC Corporation (JP)

( * ) Notice: Subject to any disclaimer, the term of this patent is extended or adjusted under 35 U.S.C. 154(b) by 0 days.

(21) Appl. No.: 09/487,388

(22) Filed: Jan. 18, 2000

(30) Foreign Application Priority Data

Jan. 19, 1999 (JP) .................................................. 11-010843

(51) Int. Cl.[7] .................................................. H01L 21/44
(52) U.S. Cl. .................................................. 438/655
(58) Field of Search .................................................. 438/655, 197, 438/199, 202, 203, 234, 313, 322, 581, 583, 649, 651, 664, 682, 721, 755

(56) References Cited

U.S. PATENT DOCUMENTS 5,190,888 * 3/1993 Schwalke et al. .................. 437/57

OTHER PUBLICATIONS

Goto, K. et al, "Leakage Mechanism and Optimized Conditions of Co Salicide Process for Deep–Submicron CMOS Devices", IEEE, 1995, pp. 449–452.

* cited by examiner

Primary Examiner—David Nelms
Assistant Examiner—Quoc Hoang
(74) Attorney, Agent, or Firm—Hayes, Soloway, Hennessey, Grossman & Hage

(57) ABSTRACT

In this method, metal film to be subject to silicidation includes impurity to have the same conductivity mechanism as an element that is in advance ion-implanted into abase layer, therefore the absorption of impurity into the metal film is difficult to incur during the silicidation reaction. Even after forming the silicide self-aligned, the surface impurity concentration at the gate or diffusion layer can be kept high, thus preventing the device characteristic from deteriorating.

12 Claims, 6 Drawing Sheets

METHOD FOR MAKING SEMICONDUCTOR DEVICE

FIELD OF THE INVENTION

This invention relates to a method for making a semiconductor device, and more particularly to, a method for forming electrodes by using the salicide process that silicide film is formed self-aligned on the gate electrode and diffusion layer of semiconductor device.

BACKGROUND OF THE INVENTION

In the salicide process (or self-aligned silicide process), where silicide film is formed self-aligned on the gate electrode and diffusion layer of semiconductor device, it is important to form silicide film with uniform thickness and low and stable resistivity on the gate electrode and diffusion layer.

Accordingly, the salicide process using titanium (Ti) that offers silicide film with a low resistivity and proper Schottky-barrier height to p-and n-type silicon has been employed.

However, in this process, according as semiconductor devices are increasingly micro-structured, the impurity concentration on the surface of gate electrode and diffusion layer increases and further the pattern dimensions are also micro-structured. Therefore, for titanium, particularly on n-diffusion layer, the phase transition temperature from high-resistance C49-structured titanium disilicide ($TiSi_2$) to low-resistance C54-structured titanium disilicide increases and deviates from the phase transition temperature on p-silicon.

Thus, when the thermal treatment temperature during silicidation is adapted for n-diffusion layer, there occurs a problem that on p-gate and p-diffusion layer, due to the excessive silicidation reaction, the leak characteristic of p-n junction deteriorates or silicide film incurs agglomeration. On the other hand, when the thermal treatment temperature during silicidation is adapted for p-gate or p-diffusion layer, there occurs a problem that on n-diffusion layer, due to lack of silicide reaction, the resistance of silicide film increases or the thermal stability lowers. Therefore, the above process is not a satisfactory process to form silicide film self-aligned on the gate electrode and diffusion layer of semiconductor device.

K. Goto et al., Technical Digest of IEEE International Electron Device Meeting 1995 (IDEM95), pp. 449–452 (1995) discloses a process that silicide film is formed self-aligned selectively on the gate electrode and diffusion layer of semiconductor device using cobalt (Co) that gives less difference in silicidation reaction temperature between p-silicon and n-silicon than titanium.

The process is explained in FIGS. 1A to 1D, which are schematic cross sectional views showing the process sequentially.

First, as shown in FIG. 1A, a MOSFET (metal oxide semiconductor field effect transistor) composed of a device separation region 302 formed by selective oxidation (LOCOS), gate oxide film 303, n-gate silicon film 304a, sidewall 305, and n-diffusion layer 306a with 100 nm $n^+/p$ junction depth is formed on a predetermined region of a silicon substrate 301. Then, as shown in FIG. 1B, 10 nm thick cobalt film 308e is formed thereon by sputtering.

Then, 30 nm thick titanium nitride (TiN) film 309 is formed thereon by sputtering. The titanium nitride film 309 is intended to prevent the oxidation during silicidation thermal treatment of cobalt.

Then, as shown in FIG. 1C, by lamp rapid thermal processing, first thermal treatment is conducted to the silicon substrate 301 in nitrogen atmosphere at 550° C. for 30 seconds. Thereby, the surface of n-gate silicon film 304a and n-diffusion layer 306a is reacted with the cobalt film 308e. Thus, $Co_xSi_y$ film 310 ($x \geq y$), which is the reaction layer of Co and Si, is formed self-aligned on the n-gate silicon film 304a and the n-diffusion layer 306a.

Then, as shown in FIG. 1D, unreacted cobalt film left on the titanium nitride film 309, the device separation region or the sidewall is removed by wet etching. Thereafter, by lamp rapid thermal processing, second thermal treatment is conducted in nitrogen atmosphere at 750 to 900° C. for 30 seconds. Thereby, the $Co_xSi_y$ film 310 on the surface of n-gate silicon film 304a and n-diffusion layer 306a is phase-transitioned to cobalt disilicide ($CoSi_2$) film 311 that is thermally and compositionally stable and at a low resistivity.

In this process, the problems (increased resistance of silicide film, and agglomeration of silicide film), mentioned earlier, due to an increase in the phase-transition temperature from high-resistance C49-structured titanium disilicide to low-resistance C54-structured titanium disilicide in high-concentration impurity region can be solved by using cobalt as silicidation metal instead of titanium, and by forming titanium nitride film as oxidation prevention film for cobalt during thermal treatment on the cobalt film.

However, even when the impurity concentration on the surface of gate and diffusion layer is needed to further increase in order to prevent from being depleted according as devices are further micro-structured, the surface impurity concentration may reduce since, during silicide reaction, impurity such as arsenic (As), phosphorus (P) and boron (B) is absorbed from silicon to silicide film. Such reduction of surface impurity concentration can influence the device characteristic seriously.

Thus, it is not suitable that metal such as cobalt that the silicon consumption during silicidation reaction is more than titanium is applied to the micro-structured semiconductor device that requires high surface impurity concentration. Namely, this process also fails to solve the problems of the prior salicide process thoroughly.

SUMMARY OF THE INVENTION

Accordingly, it is an object of the invention to provide a method for making a semiconductor device that the silicide film can be formed without lowering the surface impurity concentration.

According to the invention, a method for forming silicide film selectively on a gate electrode and a diffusion layer of p-type transistor and n-type transistor that are composed of a gate oxide film formed in a predetermined region of a device formation region, a gate electrode of p-type or n-type gate silicon film formed on the gate oxide film, a sidewall of insulating film formed on both sides of the gate electrode, and a p-type or n-type diffusion layer formed in a predetermined region of the device formation region, which are disposed through a device separation region formed in a predetermined region on a silicon substrate, comprises the steps of:

forming selectively first mask film to expose only the region of the n-type transistor;

forming selectively first metal film including V-group element only on the exposed n-type gate electrode and the n-type diffusion layer;

removing the first mask film;

forming selectively second mask film to expose only the region of the p-type transistor;

forming selectively second metal film including III-group element only on the exposed p-type gate electrode and the p-type diffusion layer;

removing the second mask film; and conducting thermal treatment to the silicon substrate so that the n-type gate electrode and the n-type diffusion layer, and the p-type gate electrode and the p-type diffusion layer react with the first metal film and the second metal film, respectively.

According to another aspect of the invention, a method for forming silicide film selectively on a gate electrode and a diffusion layer of p-type transistor and n-type transistor that are composed of a gate oxide film formed in a predetermined region of a device formation region, a gate electrode of p-type or n-type gate silicon film formed on the gate oxide film, a sidewall of insulating film formed on both sides of the gate electrode, and a p-type or n-type diffusion layer formed in a predetermined region of the device formation region, which are disposed through a device separation region formed in a predetermined region on a silicon substrate, comprises the steps of:

forming selectively first mask film to expose only the region of the p-type transistor;

forming selectively first metal film including III-group element only on the exposed p-type gate electrode and the p-type diffusion layer;

removing the first mask film;

forming selectively second mask film to expose only the region of the n-type transistor;

forming selectively second metal film including V-group element only on the exposed n-type gate electrode and the n-type diffusion layer;

removing the second mask film; and conducting thermal treatment to the silicon substrate so that the n-type gate electrode and the n-type diffusion layer, and the p-type gate electrode and the p-type diffusion layer react with the first metal film and the second metal film, respectively.

BRIEF DESCRIPTION OF THE DRAWINGS

The invention will be explained in more detail in conjunction with the appended drawings, wherein.

DESCRIPTION OF THE PREFERRED EMBODIMENTS

Figure 1A:
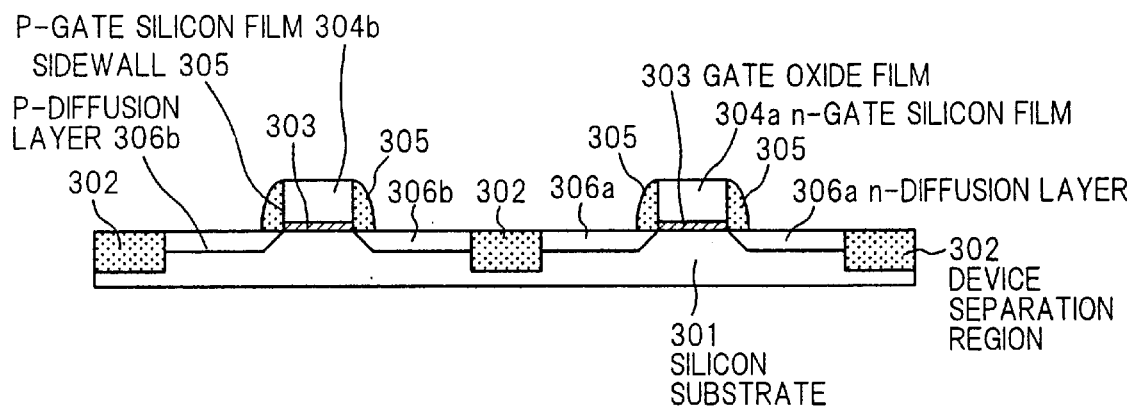
FIGS. 1A to 1D are schematic cross sectional views showing the prior method for making a semiconductor device.
Figure 1B:
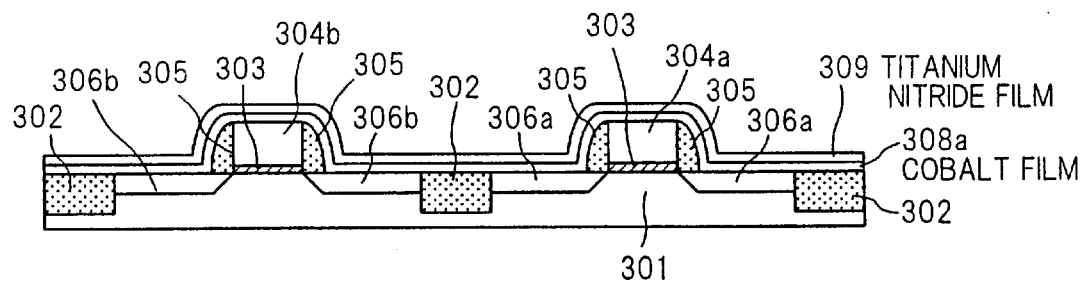
Figure 1C:
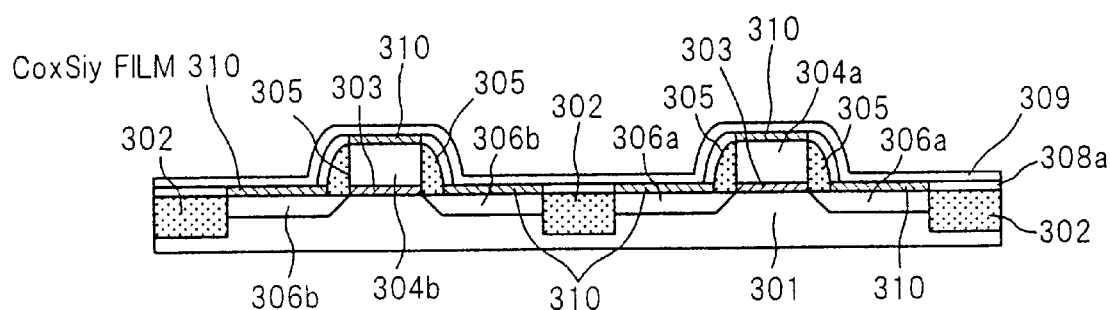
Figure 1D:
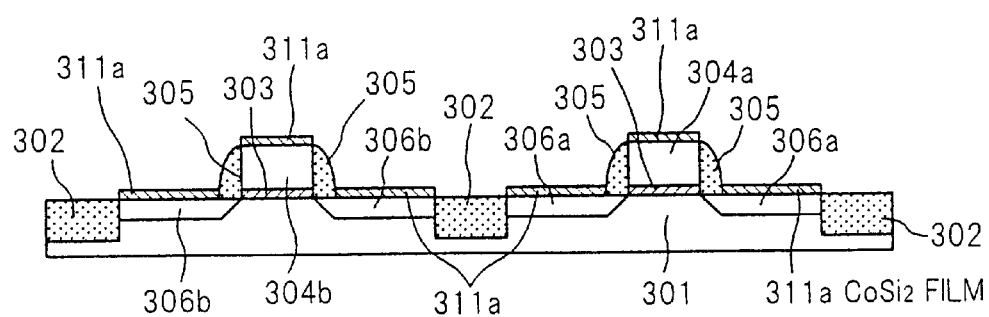

The preferred embodiments of the invention will be explained below referring to the drawings.

FIGS. 2A to 2E are schematic cross sectional views showing a method for making a semiconductor device in the first preferred embodiment according to the invention.

Figure 2A:
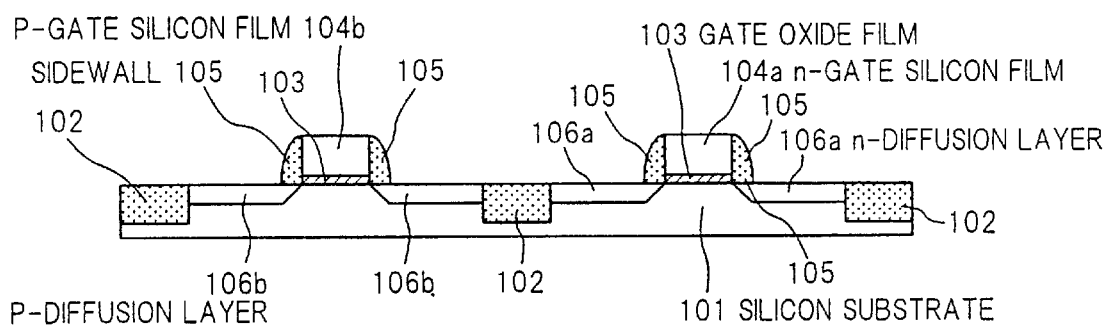
FIGS. 2A to 2E are schematic cross sectional views showing a method for making a semiconductor device in a first preferred embodiment according to the invention.

First, as shown in FIG. 2A, on a predetermined region of a silicon substrate 101, through a 300 to 400 nm deep and 200 to 500 nm wide device separation region 102 that is of silicon dioxide film and has a buried-groove structure, formed by using known material and method are nMOS transistor and pMOS transistor that are composed of 5 nm thick gate oxide film 103, 100 to 250 nm wide and 100 to 150 nm thick n-gate silicon film 104a and p-gate silicon film 104b that are of n-type silicon and p-type silicon, respectively, 80 to 100 nm sidewall 105 that is formed on the side of n-and p-gate silicon films, and n-diffusion layer 106a and p-diffusion layer 106b that are formed on both sides of the sidewall.

The nMOS transistor region and pMOS transistor region need different impurities (V-group element and III-group element) to be implanted. This is conducted by selective ion implantation using photoresist as a mask.

Figure 2B:
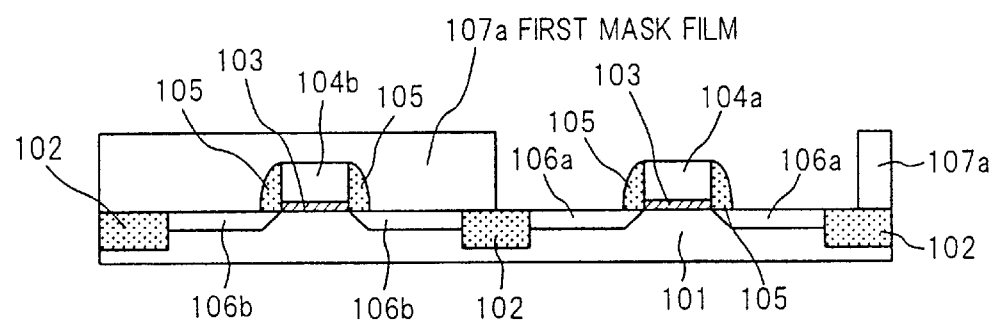

Then, as shown in FIG. 2B, using lithography technology, about 500 nm thick first mask film 107a of photoresist is formed so that only the n-gate silicon film 104a and n-diffusion layer 106a composing nMOS transistor and the surrounding device separation region 102 are exposed and the p-MOS transistor region is covered with the first mask film 107a.

Figure 2C:
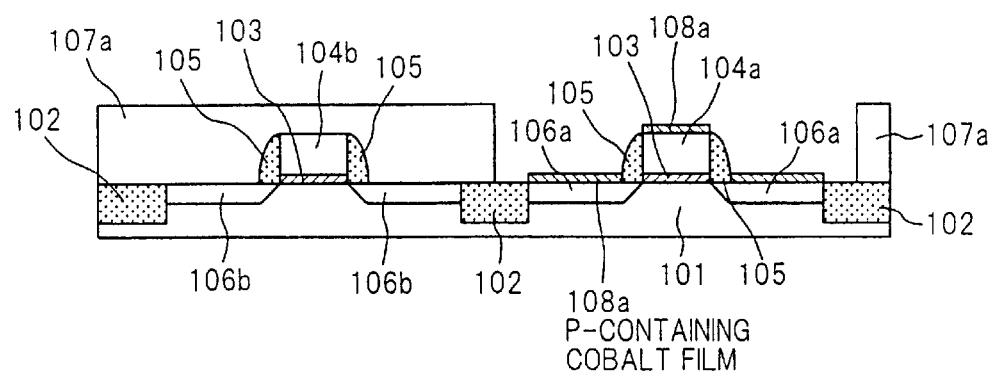

Then, as shown in FIG. 2C, by electroless cobalt plating, 10 to 15 nm thick phosphorus-containing cobalt film 108a is formed selectively only on then-gate silicon film 104a and n-diffusion layer 106a.

Plating solution used for electroless cobalt plating includes cobalt chloride as main component, sodium hypophosphite as reductant, and sodium tartrate or ammonium chloride as pH adjuster or pH stabilizer.

The phosphorus-containing cobalt film 108a is formed by the process below.

The silicon substrate 101 is soaked into palladium (II) chloride solution with a concentration of 0.01 to 0.05 g/l for 10 to 30 seconds, thereby about 1 to 3 nm very thin palladium (Pd) film (not shown) precipitates only in the region where silicon is exposed of the silicon substrate. Then, the wafer is washed with pure water.

This treatment is conducted to help plating film to precipitate uniformly by precipitating palladium with high catalytic activity on the surface of silicon. If clean silicon substrate is exposed in the plating, the soaking treatment of the silicon substrate into palladium (II) chloride solution is not always necessary.

Then, the silicon substrate 101 is soaked into the above-mentioned plating solution that is kept constant at a temperature of 50 to 90° C., thereby 10 to 15 nm thick phosphorus-containing cobalt film 108a is formed selectively in the region where silicon is exposed, i.e. on the n-gate silicon film 104a and n-diffusion layer 106a.

When the growth speed of plated film is required to lower to form thin and uniform phosphorus-containing cobalt film 108a, or when it is desired that the influence to resist, mask film is reduced, to lower the concentration of reductant, to adjust pH of plating solution, to lower the temperature of plating bath etc. may be taken.

Phosphorus is included in the cobalt film because sodium hypophosphite as reductant is deformed when it reduces cobalt ion into metal and is left as phosphorus in the film. The amount of phosphorus included depends on the plating solution and plating condition. However, if the concentration of phosphorus in the film is too high, phosphorus can react with cobalt in the film during the thermal treatment in silicidation, generating a compound. Therefore, it is desired that the concentration of phosphorus in the film be not more than about 2.0 at %.

In the electroless cobalt plating process, even when the selectivity of cobalt film growth is reduced to such non-selective level that cobalt film is plated on the first mask film, device separation region or sidewall, the cobalt film grown non-selectively can be removed by etching using mixed solution of ammonium and hydrogen peroxide solution or mixed solution of hydrochloric acid and hydrogen peroxide solution after removing the first mask film or thermal treatment.

Figure 2D:
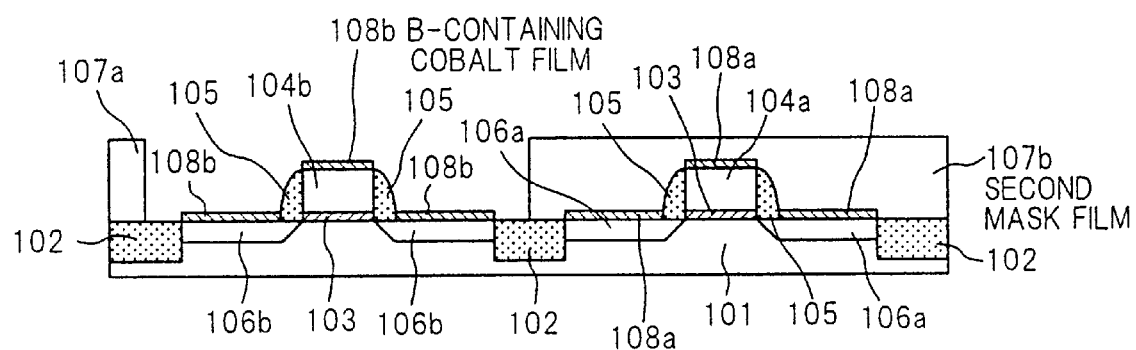

Furthermore, as shown in FIG. 2D, using lithography technology, second mask film 107b of photoresist is formed so that only the p-gate silicon film 104b and p-diffusion layer 106b composing PMOS transistor and the surrounding device separation region 102 are exposed and the n-MOS transistor region is covered with the second mask film 107b.

Then, by electroless cobalt plating, 10 to 15 nm thick boron-containing cobalt film 108b is formed selectively only on the p-gate silicon film 104b and p-diffusion layer 106b. Plating solution used for the electroless cobalt plating, different from the case of on n-silicon, includes cobalt chloride as main component and sodium boro-hydride as reductant, but the plating method is similar to that on the n-silicon.

Boron is included in the cobalt film because sodium boro-hydride as reductant is deformed when it reduces cobalt ion into metal and is left as boron in the film. The amount of boron included depends on the plating solution and plating condition. However, if the concentration of boron in the film is too high, boron can react with cobalt in the film during the thermal treatment in silicidation, generating a compound. Therefore, it is desired that the concentration of boron in the film be not more than about 2.0 at %.

The growth speed of film formation is adjusted by concentration of reductant, pH of plating solution, plating temperature etc. The order of the plating of cobalt film on n-silicon and p-silicon is not limited to the order described above. The plated film may be first formed on p-silicon.

Even when the cobalt film growth is non-selective, the cobalt film grown non-selectively can be removed by wet-etching after removing the second mask film or thermal treatment.

Figure 2E:
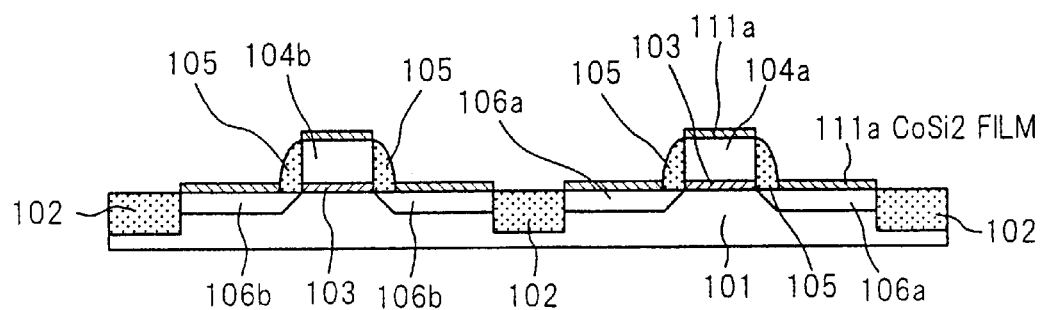

Then, as shown in FIG. 2E, by lamp rapid thermal processing, the thermal treatment is conducted in nitrogen atmosphere at 400 to 800° C. for 10 to 30 seconds. Thereby, the n-gate silicon film 104a and n-diffusion layer 106a, and the p-gate silicon film 104b and p-diffusion layer 106b are reacted with the phosphorus-containing cobalt film 108a and boron-containing cobalt film 108b, respectively. Thus, it is phase-transitioned to cobalt disilicide ($CoSi_2$) film 111a.

This thermal treatment may be performed in two stages. Also, before the thermal treatment, film to prevent the oxidation of cobalt, for example titanium nitride film, may be formed on the silicon substrate. In this case, the thermal treatment is conducted in two stages like the prior process, and the oxidation prevention film is removed after completing the first thermal treatment.

Meanwhile, in this reaction process, since the metal film to be subject to the silicidation includes impurity to have the same conductivity mechanism as the element that is in advance ion-implanted into the base layer, the absorption of impurity into the metal film is difficult to incur during the silicidation reaction. Therefore, even after forming the silicide self-aligned, the surface impurity concentration at the gate or diffusion layer can be kept high, thus preventing the device characteristic from deteriorating.

In the first embodiment, the first and second metal films to be subject to the silicidation can be composed of nickel instead of cobalt.

FIGS. 3A to 3E are schematic cross sectional views showing a method for making a semiconductor device in the second preferred embodiment according to the invention.

Figure 3A:
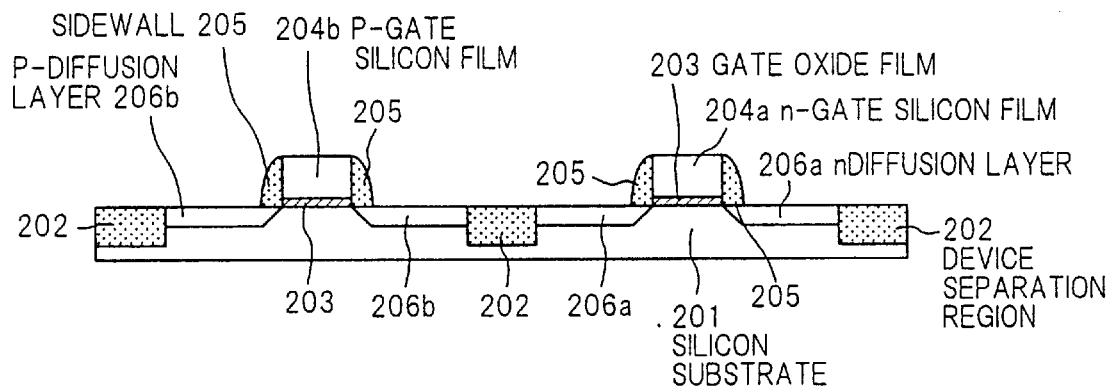
FIGS. 3A to 3E are schematic cross sectional views showing a method for making a semiconductor device in a second preferred embodiment according to the invention.

First, as shown in FIG. 3A, on a predetermined region of a silicon substrate 201, through a 300 to 400 nm deep and 200 to 500 nm wide device separation region 202 that is of silicon dioxide film and has a buried-groove structure, formed by using known material and method are nMOS transistor and PMOS transistor that are composed of 5 nm thick gate oxide film 203, 100 to 250 nm wide and 100 to 150 nm thick n-gate silicon film 204a and p-gate silicon film 204b that are of n-type silicon and p-type silicon, respectively, 80 to 100 nm sidewall 205 that is formed on the side of n-and p-gate silicon films, and n-diffusion layer 206a and p-diffusion layer 206b that are formed on both sides of the sidewall.

Figure 3B:
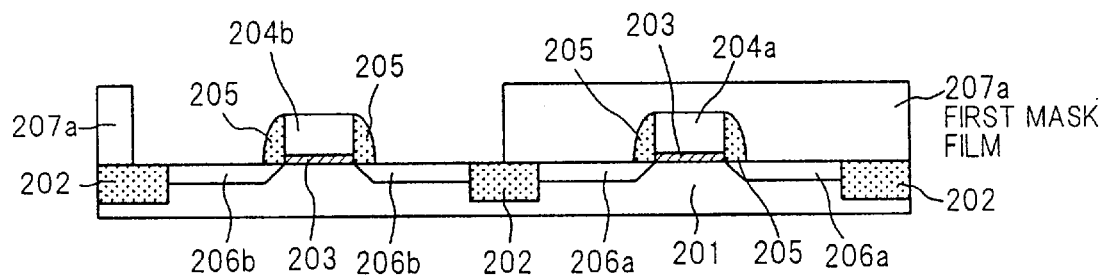

Then, as shown in FIG. 3B, using lithography technology, about 500 nm thick first mask film 207a of photoresist is formed so that only the p-gate silicon film 204b and p-diffusion layer 206b composing PMOS transistor and the surrounding device separation region 202 are exposed and the n-MOS transistor region is covered with the first mask film 207a.

Figure 3C:
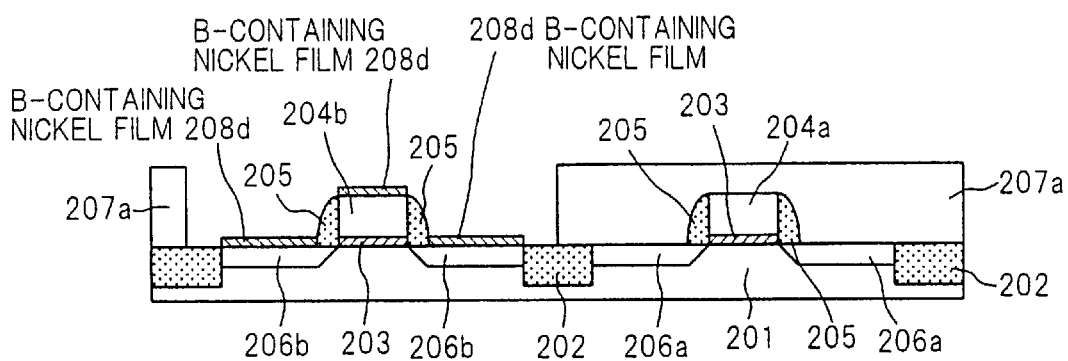

Then, as shown in FIG. 3C, by electroless nickel plating, 10 to 15 nm thick boron-containing nickel film 208d is formed selectively only on the p-gate silicon film 204b and p-diffusion layer 206b.

Plating solution used for electroless nickel plating includes nickel chloride as main component, dimethylamineborane as reductant, malonic acid, ammonium etc.

The boron-containing nickel film 208d is formed by the process below.

The silicon substrate 201 is soaked into palladium (II) chloride solution with a concentration of 0.01 to 0.05 g/l for 10 to 30 seconds, thereby about 1 to 3 nm very thin palladium (Pd) film (not shown) precipitates only in the region where silicon is exposed of the silicon substrate. Then, the wafer is washed with pure water.

This treatment is conducted to help plating film to precipitate uniformly by precipitating palladium with high catalytic activity on the surface of silicon. If clean silicon substrate is exposed in the plating, the soaking treatment of the silicon substrate into palladium (II) chloride solution is not always necessary.

Then, the silicon substrate 201 is soaked into the above-mentioned plating solution that is kept constant at a temperature of 40 to 60° C., thereby 10 to 15 nm thick boron-containing nickel film 208d is formed selectively in the region where silicon is exposed, i.e. on the p-gate silicon film 204b and p-diffusion layer 206b.

When the growth speed of plated film is required to lower to form thin and uniform boron-containing nickel film 208d, to adjust pH of plating solution, to lower the temperature of plating bath etc. may be taken.

Boron is included in the nickel film because dimethylamineborane as reductant is deformed when it reduces nickel ion into metal and is left as boron in the film. The amount of boron included depends on the plating solution and plating condition. However, as described in the first embodiment, it is desired that the concentration of boron in the film be not more than about 0.5 at %.

In the electroless nickel plating process, even when the selectivity of nickel film growth is reduced to such non-selective level that nickel film is plated on the first mask film, device separation region or sidewall, the nickel film grown non-selectively can be removed by wet-etching after removing the first mask film or thermal treatment.

Figure 3D:
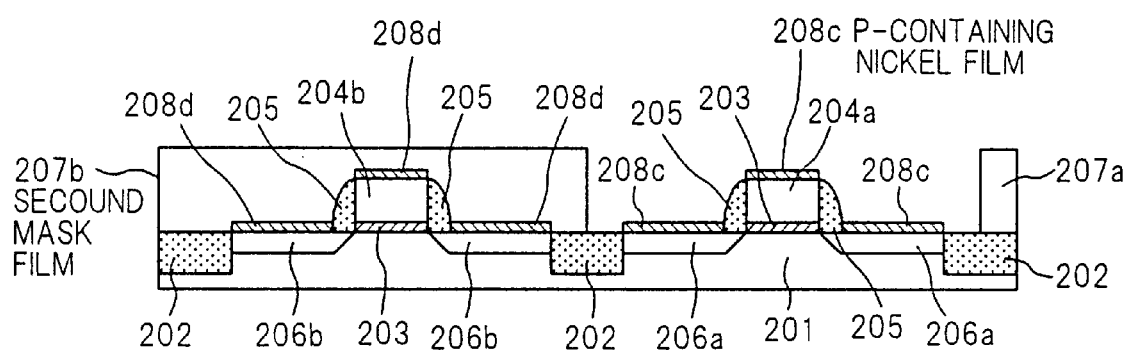

Furthermore, as shown in FIG. 3D, using lithography technology, second mask film 207b of photoresist is formed so that only the n-gate silicon film 204a and n-diffusion layer 206a composing nMOS transistor and the surrounding device separation region 202 are exposed and the p-MOS transistor region is covered with the second mask film 207b.

Then, by electroless nickel plating, 10 to 15 nm thick phosphorus-containing nickel film 208c is formed selectively only on the n-gate silicon film 204a and n-diffusion layer 206a. Plating solution used for the electroless nickel plating, different from the case of on p-silicon, includes sodium hypophosphite as reductant, but the plating method is similar to that on the p-silicon.

Phosphorus is included in the nickel film because sodium hypophosphite as reductant is deformed when it reduces nickel ion into metal and is left as phosphorus in the film. The amount of phosphorus included depends on the plating solution and plating condition. However, by the reason above, it is desired that the concentration of phosphorus in the film be not more than about 2.0 at %.

The growth speed of film formation is adjusted by concentration of reductant, pH of plating solution, plating temperature etc. The order of the plating of nickel film on n-silicon and p-silicon is not limited to the order described above.

Even when the nickel film growth is non-selective, the nickel film grown non-selectively can be removed by wet-etching after removing the second mask film or thermal treatment.

Figure 3E:
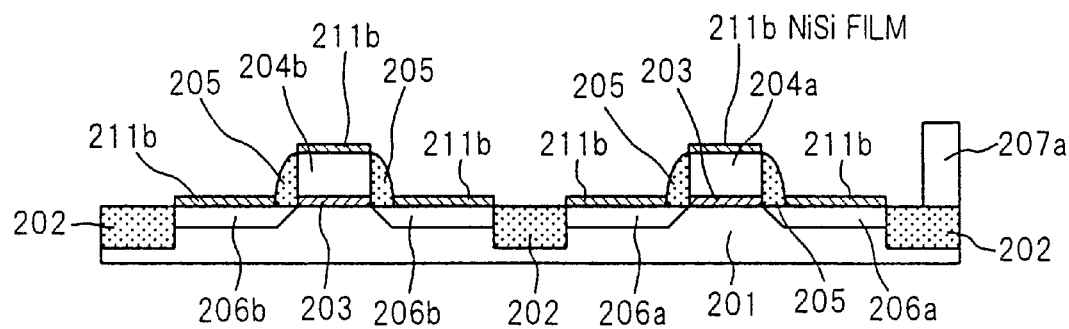

Then, as shown in FIG. 3E, by lamp rapid thermal processing, the thermal treatment is conducted in nitrogen atmosphere at 400 to 800° C. for 10 to 30 seconds. Thereby, the n-gate silicon film 204a and n-diffusion layer 206a, and the p-gate silicon film 204b and p-diffusion layer 206b are reacted with the phosphorus-containing nickel film 208c and boron-containing nickel film 208d, respectively. Thus, it is phase-transitioned to nickel monosilicide (NiSi) film 211b.

Before the thermal treatment, film to prevent the oxidation of nickel, for example titanium nitride film, may be formed on the silicon substrate. In this case, the thermal treatment is conducted in two stages like the prior process, and the oxidation prevention film is removed after completing the first thermal treatment.

In this reaction process, since the metal film to be subject to the silicidation includes impurity to have the same conductivity mechanism as the element that is in advance ion-implanted into the base layer, the absorption of impurity into the metal film is difficult to incur during the silicidation reaction. Therefore, even after forming the silicide self-aligned, the surface impurity concentration at the gate or diffusion layer can be kept high, thus preventing the device characteristic from deteriorating.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching here is set forth.

What is claimed is:

1. A method for forming silicide film selectively on a gate electrode and a diffusion layer of p-type transistor and n-type transistor that are composed of a gate oxide film formed in a predetermined region of a device formation region, a gate electrode of p-type or n-type gate silicon film formed on said gate oxide film, a sidewall of insulating film formed on both sides of said gate electrode, and a p-type or n-type diffusion layer formed in a predetermined region of said device formation region, which are disposed through a device separation region formed in a predetermined region on a silicon substrate, comprising the steps of:

forming selectively first mask film to expose only the region of said n-type transistor;

forming selectively first metal film including V-group element only on said exposed n-type gate electrode and said n-type diffusion layer;

removing said first mask film;

forming selectively second mask film to expose only the region of said p-type transistor;

forming selectively second metal film including III-group element only on said exposed p-type gate electrode and said p-type diffusion layer;

removing said second mask film; and conducting thermal treatment to said silicon substrate so that said n-type gate electrode and said n-type diffusion layer, and said p-type gate electrode and said p-type diffusion layer react with said first metal film and said second metal film, respectively.

2. A method, according to claim 1, wherein:
said first and second mask films are composed of photoresist.

3. A method, according to claim 1, wherein:
said first and second metal films are composed of cobalt or nickel.

4. A method, according to claim 1, wherein:
said first and second metal films are formed by electroless plating.

5. A method, according to claim 1, wherein:
said III-group element is boron (B).

6. A method, according to claim 1, wherein:
said V-group element is phosphorus (P).

7. A method for forming silicide film selectively on a gate electrode and a diffusion layer of p-type transistor and n-type transistor that are composed of a gate oxide film formed in a predetermined region of a device formation region, a gate electrode of p-type or n-type gate silicon film formed on said gate oxide film, a sidewall of insulating film formed on both sides of said gate electrode, and a p-type or n-type diffusion layer formed in a predetermined region of said device formation region, which are disposed through a device separation region formed in a predetermined region on a silicon substrate, comprising the steps of:

forming selectively first mask film to expose only the region of said p-type transistor;

forming selectively first metal film including III-group element only on said exposed p-type gate electrode and said p-type diffusion layer;

removing said first mask film;

forming selectively second mask film to expose only the region of said n-type transistor;

forming selectively second metal film including V-group element only on said exposed n-type gate electrode and said n-type diffusion layer;

removing said second mask film; and conducting thermal treatment to said silicon substrate so that said n-type gate electrode and said n-type diffusion layer, and said p-type gate electrode and said p-type diffusion layer react with said first metal film and said second metal film, respectively.

8. A method, according to claim 7, wherein:
said first and second mask films are composed of photoresist.

9. A method, according to claim 7, wherein:
said first and second metal films are composed of cobalt or nickel.

10. A method, according to claim 7, wherein:
said first and second metal films are formed by electroless plating.

11. A method, according to claim 7, wherein: said III-group element is boron (B).

12. A method, according to claim 7, wherein: said V-group element is phosphorus (P).

* * * * *

UNITED STATES PATENT AND TRADEMARK OFFICE
CERTIFICATE OF CORRECTION

PATENT NO.   : 6,232,227 B1
DATED        : May 15, 2002
INVENTOR(S)  : Makagi

It is certified that error appears in the above-identified patent and that said Letters Patent is hereby corrected as shown below:

<u>Title page,</u>
Item [57], ABSTRACT, should read:

-- ABSTRACT
In this method, metal film to be subject to silicidation includes impurity to have the same conductivity mechanism as an element that is in advance ion-implanted into a base layer, therefore the absorption of impurity into the metal film is difficult to incur during the silicidation reaction. Even after forming the silicide self-aligned, the surface impurity concentration at the gate of diffusion layer can be kept high, thus preventing the device characteristic from deteriorating. --

Signed and Sealed this

Eleventh Day of February, 2003

JAMES E. ROGAN
*Director of the United States Patent and Trademark Office*